US008672428B2

(12) United States Patent
Takeuchi et al.

(10) Patent No.: US 8,672,428 B2
(45) Date of Patent: Mar. 18, 2014

(54) HOUSING FOR OPTICAL ELEMENTS

(75) Inventors: Kenichiro Takeuchi, North Brunswick, NJ (US); Haiguang Lu, Los Altos, CA (US)

(73) Assignee: Go!Foton Holdings, Inc., Somerset, NJ (US)

( * ) Notice: Subject to any disclaimer, the term of this patent is extended or adjusted under 35 U.S.C. 154(b) by 67 days.

(21) Appl. No.: 13/279,874

(22) Filed: Oct. 24, 2011

(65) Prior Publication Data

US 2013/0099644 A1 Apr. 25, 2013

(51) Int. Cl.
*E05C 7/06* (2006.01)
(52) U.S. Cl.
USPC .................. 312/222; 292/58; 292/67
(58) Field of Classification Search
USPC .......... 174/652, 655, 656; 292/57–59, 63–64, 292/67–68, 101–103, 109–110, 114, 116, 292/117, 120, 130, 131, 136, DIG. 11, 292/DIG. 63; 312/215, 222; 385/138
See application file for complete search history.

(56) References Cited

U.S. PATENT DOCUMENTS

| | | | | |
|---|---|---|---|---|
| 413,245 A * | 10/1889 | Richmond | ................... | 292/175 |
| 732,450 A * | 6/1903 | Schiermeyer | ................ | 292/116 |
| 983,647 A * | 2/1911 | Romines | ....................... | 292/111 |
| 3,252,746 A * | 5/1966 | Kafferlin et al. | ........... | 312/234.3 |
| 4,061,371 A * | 12/1977 | Prather et al. | ................. | 292/198 |
| 4,549,038 A * | 10/1985 | Masheris et al. | .............. | 174/655 |
| 4,965,414 A * | 10/1990 | Sobotka et al. | ............. | 200/50.02 |
| 5,239,129 A * | 8/1993 | Ehrenfels | ........................ | 174/51 |
| 5,286,935 A * | 2/1994 | Mina et al. | ..................... | 200/330 |
| 5,403,976 A * | 4/1995 | Maurice | ......................... | 174/652 |
| 6,527,353 B1 * | 3/2003 | Bradfish et al. | ............ | 312/332.1 |
| 6,935,661 B1 * | 8/2005 | Farnsworth et al. | .......... | 292/162 |
| 7,595,455 B2 * | 9/2009 | Robinson | ....................... | 174/655 |
| 2012/0037416 A1 * | 2/2012 | Chiou | ............................ | 174/652 |

* cited by examiner

*Primary Examiner* — Matthew Ing
(74) *Attorney, Agent, or Firm* — Lerner, David, Littenberg, Krumholz & Mentlik, LLP

(57) ABSTRACT

A housing for enclosing optical components may include a series of fasteners, such as magnets, around the perimeter of the housing. The housing may also include a male and female or tongue-in-groove style coupling around the perimeter of the housing that may work in conjunction with fasteners around the perimeter of the housing. The perimeter of the housing may further include one or more insertion elements for receiving optical elements such as optical fibers, cables, or other wiring. An outer wall surface of the housing may include latches formed by flanges having a cavity that receive flanges without a cavity.

14 Claims, 11 Drawing Sheets

HOUSING FOR OPTICAL ELEMENTS

BACKGROUND OF THE INVENTION

The present invention relates to housings for covering optical equipment and more particularly to housings with sealing mechanisms for covering and protecting optical equipment.

Housings for enclosing optical elements often consist of plastic or metal casings having access holes around their perimeters to allow cables or wires, e.g. fiber optic, power, and telephone cables, to pass through. These housings often have doors attached to a base or frame through hinges on one side. Either of the frame or the door may have tabs or flaps on a side opposite the hinges that snap over a boss or into an indentation located on the other of the frames or doors in order to secure or close the door against the frame. Often, these tabs and the corresponding interfaces break off over time due to mechanical cycling or may not be aligned and thus do not secure the door to the frame as desired.

Furthermore, dust, dirt, and moisture can interfere with the proper operation of or degrade electrical and mechanical components, such as screws, within these housings. Existing designs do not adequately insulate these components from the environment.

In addition, based on error or improper operation by a user, user movement of the door to secure the door to the frame sometimes may not result in the door being maintained in a closed position or a seal being formed between the door and the frame, such that the interior of the housing and optical elements installed within the interior may not be protected from the external environment.

Therefore, there exists a need for fasteners that may provide more reliable means for maintaining a door against a frame of a housing for optical elements and that provide a means for sealing the components within the housing from the environment.

BRIEF SUMMARY OF THE INVENTION

In accordance with an aspect of the invention, a housing for optical elements may include a frame having a perimeter and a door rotatably coupled to the frame. The door may include a plurality of fasteners and a perimeter. The door perimeter may be capable of mating engagement with the frame perimeter. The plurality of fasteners of the door may be positioned at at least a majority of the door perimeter. The plurality of door fasteners may include magnetic material. The frame may include a plurality of fasteners detachably engageable with door fasteners.

In accordance with another aspect of the invention, a housing for optical elements may include a frame. The frame may include a perimeter, a plurality of magnetic fasteners positioned at the frame perimeter, and an engagement means adjacent to the frame perimeter having a female coupling. The housing may include a door rotatably coupled to the frame. The door may include a perimeter, a plurality of magnetic fasteners positioned at the door perimeter in a pattern corresponding to positions of the plurality of the magnetic frame fasteners at the frame perimeter, and an engagement means adjacent to the door perimeter having a male coupling. The housing may include at least one hinge rotatably coupled to a first portion of the frame perimeter to a first portion of the door perimeter. The housing may include a latch for attaching a second portion of the frame perimeter to a second portion of the door perimeter in which the door is capable of mating engagement with the frame. Such an engagement may be by engagement between corresponding fasteners of the pluralities of magnetic frame and door fasteners when the door is rotated to a position substantially opposing the frame. When the door is rotated to a closed position opposing the frame, the entire frame seal perimeter may overlap the entire door seal perimeter, and the door male coupling may be capable of insertion into the frame female coupling, to form a seal between the door male coupling and the frame female coupling.

DETAILED DESCRIPTION

Figure 1:
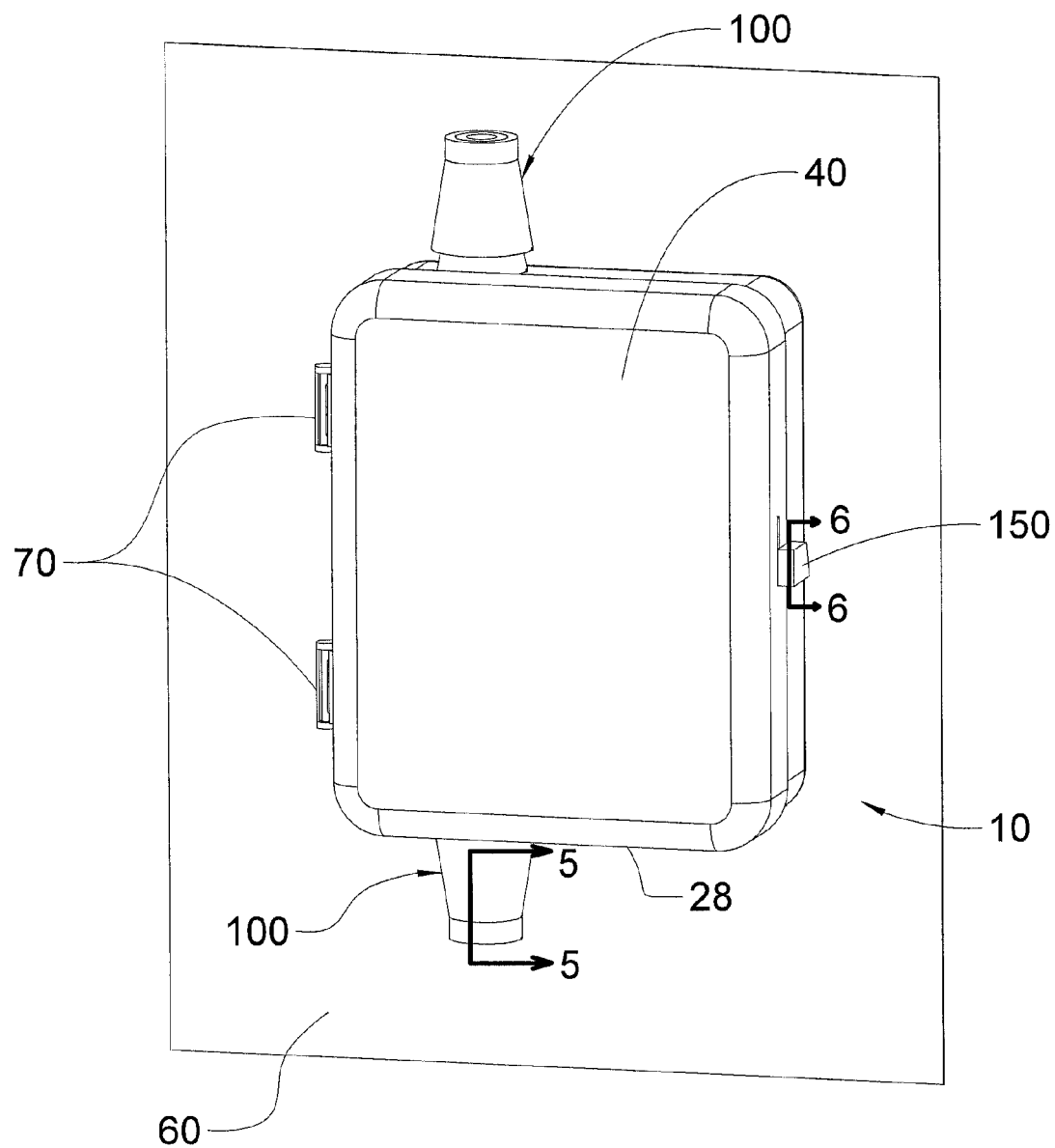
FIG. 1 is a front view of a housing for enclosing optical elements in a closed position, in accordance with an embodiment of the present invention.

In the Brief Summary of the Invention above and in the Detailed Description of the invention herein, and the claims below, and in the accompanying drawings, reference is made to particular features of the invention. It is to be understood that the disclosure of the invention in this specification includes all possible combinations of such particular features. For example, where a particular feature is disclosed in the context of a particular aspect, arrangement, or embodiment of the invention, or a particular claim, that feature can also be used, to the extent possible, in combination with and/or in the context of other particular aspects, arrangements, and embodiments of the invention, and in the invention generally.

The term "comprises" and grammatical equivalents thereof are used herein to mean that other components, ingredients, steps, etc. are optionally present. For example, an article "comprising" (or "which comprises") components A, B, and C can consist of (i.e., contain only) components A, B, and C, or can consist of not only components A, B, and C but also one or more other components.

The terms "lower," "upper," "ground," etc. and derived directional terms such as "horizontal", "vertical", "upward", and "downward" are based on a normal configuration of the apparatus described herein as shown in the drawings.

The present disclosure provides for a housing for enclosing optical components. Such a housing may include a series of fasteners, such as magnets, around the perimeter of an interior of the housing. The housing may also include a male and female or tongue-in-groove style coupling around the perimeter of the housing that may work in conjunction with fasteners around the perimeter of the housing. The perimeter of the housing may further include one or more insertion elements for receiving optical elements such as optical fibers, cables, or other wiring. An outer wall surface of the housing may include latches formed by flanges having a cavity that receive flanges without a cavity.

Figure 2:
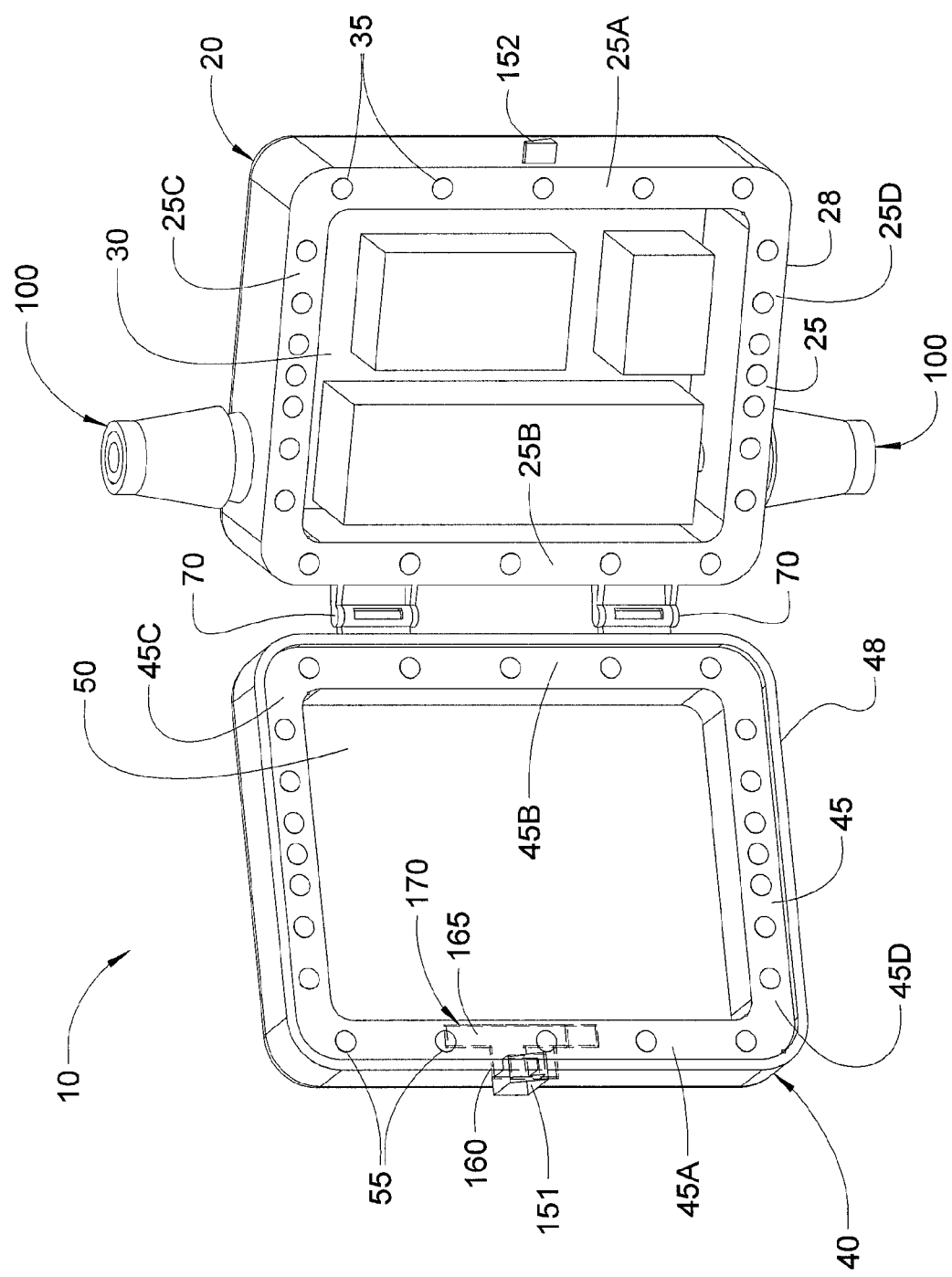
FIG. 2 is a perspective view of the housing of FIG. 1 in an open position.
Figure 3:
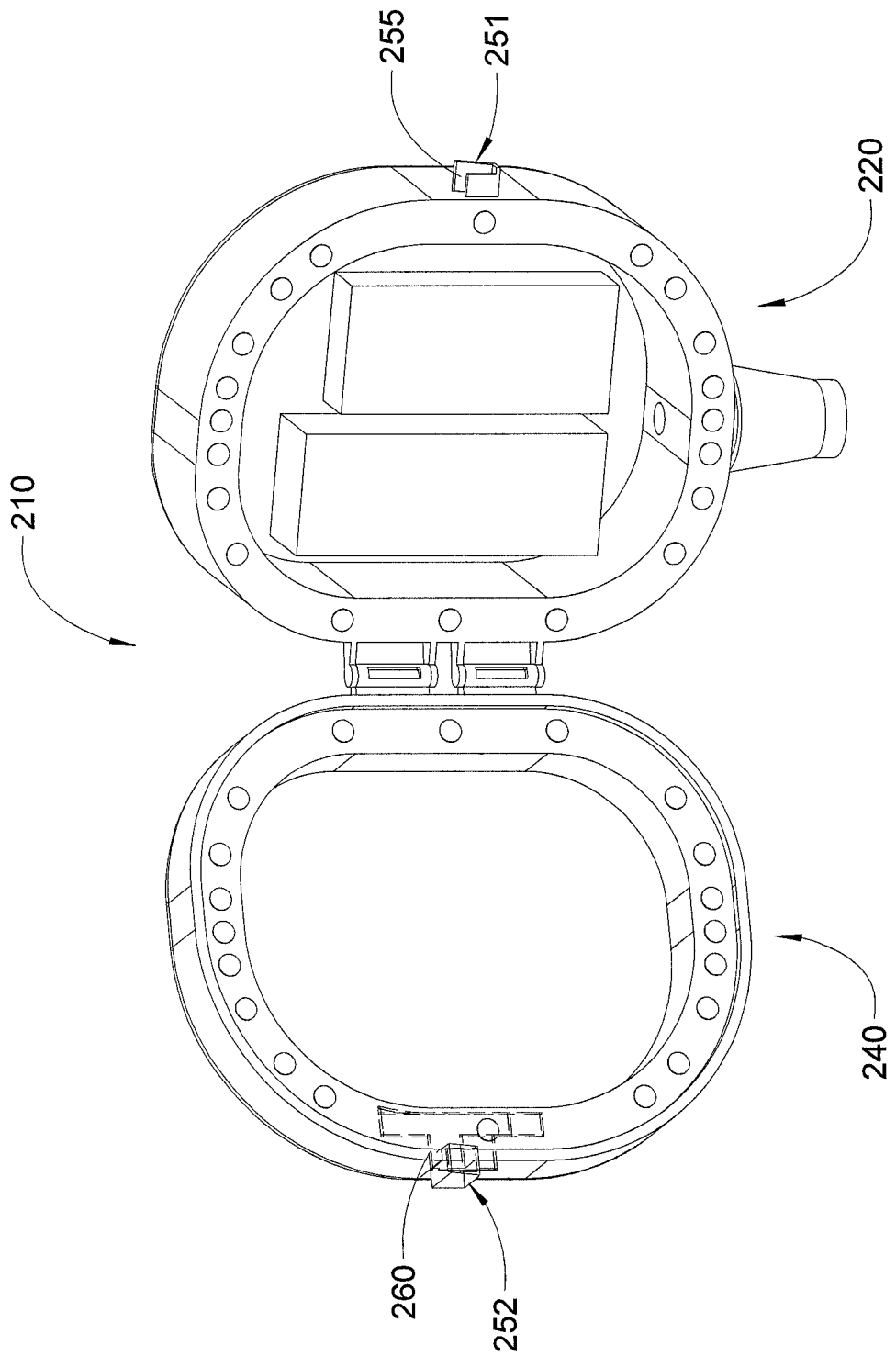
FIG. 3 is a perspective view of a housing in accordance with an embodiment of the invention, shown in an open position.

Referring now to FIGS. 1-2, a housing 10 for enclosing optical elements may include a frame 20 and a door 40. The frame 10 and the door 40 may each include a linear section, a curved section, or other profiles along at least a portion of each. For example, in the embodiments of FIGS. 2 and 3 showing the housings 10, 210 in an open position, the frame 20, 220 and the door 40, 240 may be rectangular or circular in shape. Moreover, as shown in these embodiments, the profiles of the frames 20, 220 and the door 40, 240 may be substantially the same. The frame 20 may have a perimeter 25 and an inner space 30 for receiving various electrical components such as power units, communication boxes such as optical network terminals, fiber optic cables, and other wires and cables, such as 100BaseT cables as are now commonly used.

As shown in FIG. 1, the frame 20 may be affixed to a wall 60 for permanent fixation. Standard fasteners may be used to affix the frame 20 to the wall 60. The frame 20 may be placed on a wall inside of a building, such as a wall of a residential basement, or on a wall outside of a building.

Referring again to FIGS. 1 and 2, the door 40 may include a perimeter 45 and an inner space 50 that may also receive the various electrical components just described. The door 40 may be rotatably attached to the frame 20. A portion of the perimeter 45 of the door may be attached to a portion of the perimeter 25 of the frame by at least one hinge 70. The door 40 may rotate relative to the frame 20 about the hinge 70 between a closed position and a range of open positions. In one embodiment, two hinges may be used to attach the door to the frame.

In one embodiment, the door 40 may be attached to the frame 20 through the use of fasteners. As shown in FIG. 2, fasteners 35, 55 may be placed at at least a portion of the perimeters 25, 45 of each of the frame 20 and the door 40. In this manner, the fasteners 55 on the door 40 may have corresponding fasteners 35 on the frame 20. In one embodiment, the fasteners 35, 55 on each of the frame 20 and the door 40 may be magnetic due to materials, such as iron, contained in the fasteners. Corresponding fasteners 35, 55 on the frame 20 and the door 40 may have opposite poles such that as the door 40 is rotated towards a closed position, in which the door faces and contacts the frame, through the application of an external force, the magnetic force between the fasteners 35, 55 on the frame 20 and the door 40 causes the door 40 and the frame 20 to move closer to each other without further application of the applied external force. In such an embodiment, the fasteners may cause the door 40 to continue to rotate toward the frame 20, without further application of the external force, until the corresponding fasteners on the frame 20 and the door 40 physically contact each other.

Due to the magnetic force between the fasteners 35, 55 on the frame 20 and the door 40, the frame 20 and the door may be maintained in contact with each other until an external force is applied to separate the frame and the door fasteners 35, 55. In one embodiment, the magnetic force between the corresponding contacting fasteners 35, 55 on the frame 20 and the door 40 may be a maximum force such that the external force to separate the frame 20 from the door 40 may be applied at any position at the perimeter 45 of the door 40 that is a distance away from an axis of rotation about the hinge 70. This maximum force may be a force between 1N and 50N.

In one embodiment, the force between the corresponding contacting fasteners 35, 55 may be an equal force.

In one embodiment, as shown in FIG. 2, more fasteners may be positioned along a portion of the perimeters of the door and frame than along other portions of the perimeters. For example, a larger number of fasteners may be disposed at linearly extending portions 25C, 25D, 45C, 45D of the perimeters 25, 45 that are disposed away from linearly extending portions 25A, 25B, 45A, 45B of the perimeters 25, 45 at which the hinges 70 and a latch 150 are disposed, than at the portions 25A, 25B, 45A, 45B. In one embodiment, as shown in FIGS. 1 and 2, each of the portions 25A and 25B, the portions 25C and 25D, the portions 45A and 45B, and the portions 45C and 45D are, respectively, parallel to each other, and the portions 25A, 25B are orthogonal to the portions 25C, 25D and the the portions 45A, 45B are orthogonal to the portions 45C, 45D.

Figure 4:
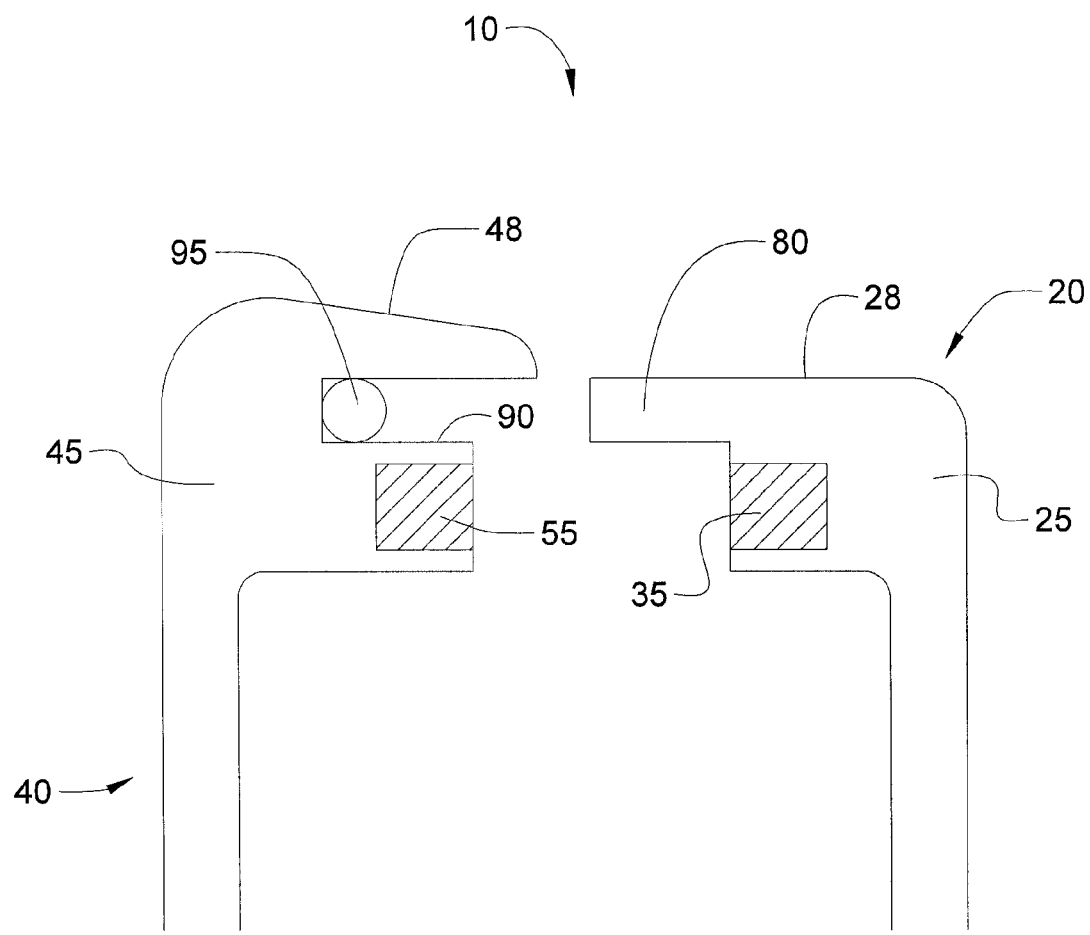
FIG. 4 is a cross-sectional view of a portion of a perimeter in accordance with an embodiment of the present invention.

As shown in the cross-sectional view of FIG. 4, in some embodiments, the perimeters 25, 45 of the frame 20 and the door 40 may include various sealing mechanisms. The frame 20 or the door 40 may have a male coupling that is engageable with a female coupling of the other of the frame 20 or the door 40 to form a seal. The male coupling may be a convex flange 80 that extends from at least a portion of either of the frame or the door perimeters 25, 45 in a direction towards the other of the frame or the door perimeters 25, 45 when the housing 10 is in the closed position. The female coupling may be a convex recess 90 on at least the frame or the door perimeters 25, 45 that is opposite the frame or the door perimeters 25, 45 having the male coupling, such as the convex flange 80, when the housing 10 is in the closed position. In this manner, the female coupling may be adapted for receiving the male coupling such that the female coupling recess 90 overlaps the male coupling flange 80. In some embodiments, a seal 95, such as a rubber strip, may be placed within the female coupling recess 90 to provide an additional sealing mechanism in addition to the interface of the male and female couplings.

The male and female couplings may be adjacent to the fasteners 35, 55. For example, as shown in FIG. 4, the male coupling flange 80 and the female coupling recess 90 may be closer to outer wall surfaces 28, 48 of the frame and the door perimeters than the fasteners 35, 55. In this manner, when the housing 10 is in the closed position, the male coupling flange 80 and the female coupling recess 90 may be engaged such that they form a seal around the inner spaces 30, 50 of the frame 20 and the door 40. In this configuration, the male coupling flange 80 and the female coupling recess 90 may additionally form a seal around the fasteners. When the fasteners are made of a material subject to oxidation or other corrosive effects, e.g. iron, the seal formed by the male and the female couplings may provide resistance to such corrosion.

In an alternative embodiment (not shown), the male and female couplings may be further from the outer surfaces of the frame and the door perimeters than the fasteners. In this configuration, the male and female couplings may not provide a seal for the fasteners, and the fasteners may be exposed to elements outside of the housing.

An insertion element 100 through which an optical fiber cable, cabling, or other wires may be inserted to extend from external the housing into the interior of the housing 10, such as a nipple, may extend from the outer wall surface 28, 48 of either the frame or the door perimeters 25, 45 of the housing 10. In the embodiment of FIGS. 1 and 2, the insertion element 100 extends from the frame 20 of the housing 10. As best shown in the exploded view of FIG. 5A, in some embodiments, the insertion element 100 may have a male portion 110 with a first section 112 that attaches to the housing 10. The first section 112 may attach to the housing 10 through a threaded connection with the outer wall surface 28, 48 of the housing 10. In some embodiments, the insertion element 100 may have a middle section 113 extending from the first section 112 towards a second section 114. In some embodiments, the middle section 113 may taper inwardly from the first section 112 towards the second section 114. An inner channel 115 may extend from the first section 112 to the second section 114. The inner channel 115 may have a diameter appropriately sized to allow an optical fiber cable element or other cables and/or wires to be inserted and, in some embodiments, to be maintained fixed in place within the channel 115 following insertion.

Figure 5:
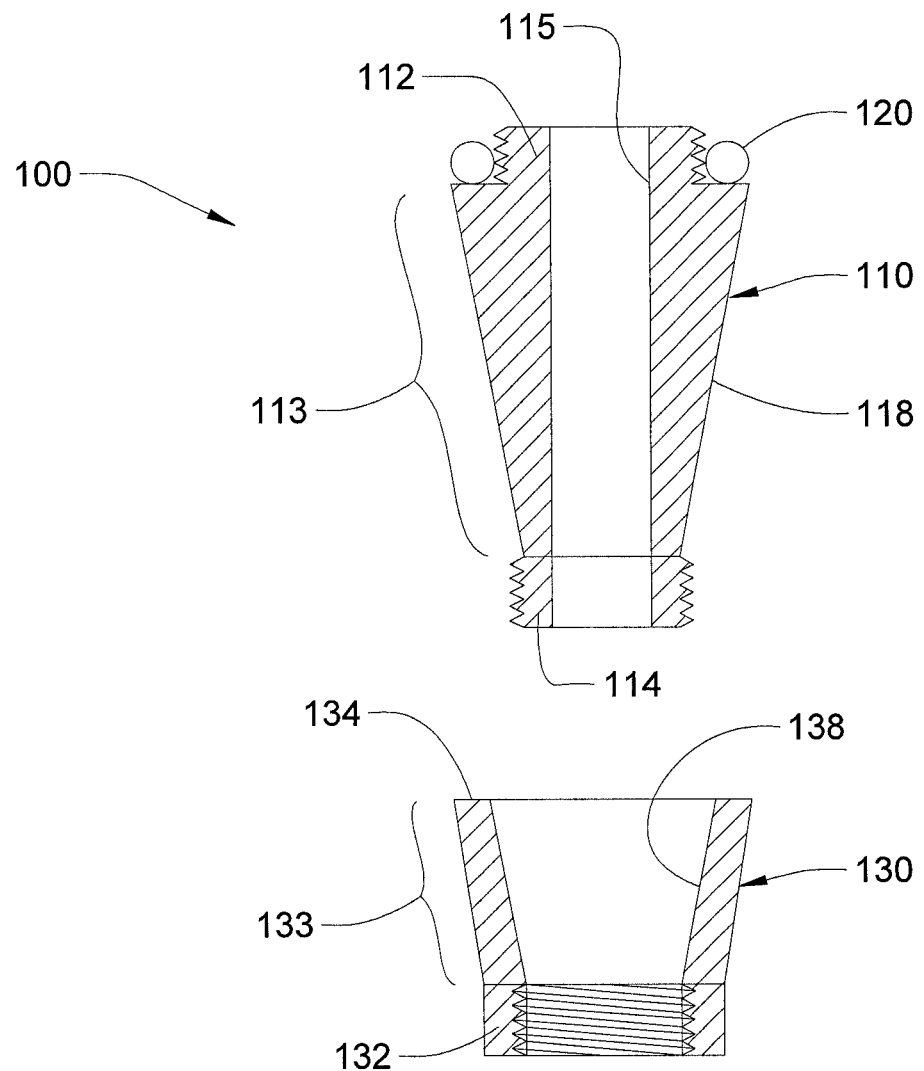
FIGS. 5A-5B are cross-sectional exploded views of an insertion element in accordance with embodiments of the present invention.
FIG. 5C is a perspective view of an insertion element in accordance with an embodiment of the present invention.
FIGS. 5D-5G are perspective views of various components of the insertion element shown of FIG. 5C.
FIG. 5H is a cross-sectional exploded view of the insertion element of FIG. 5C.
Figure 5:
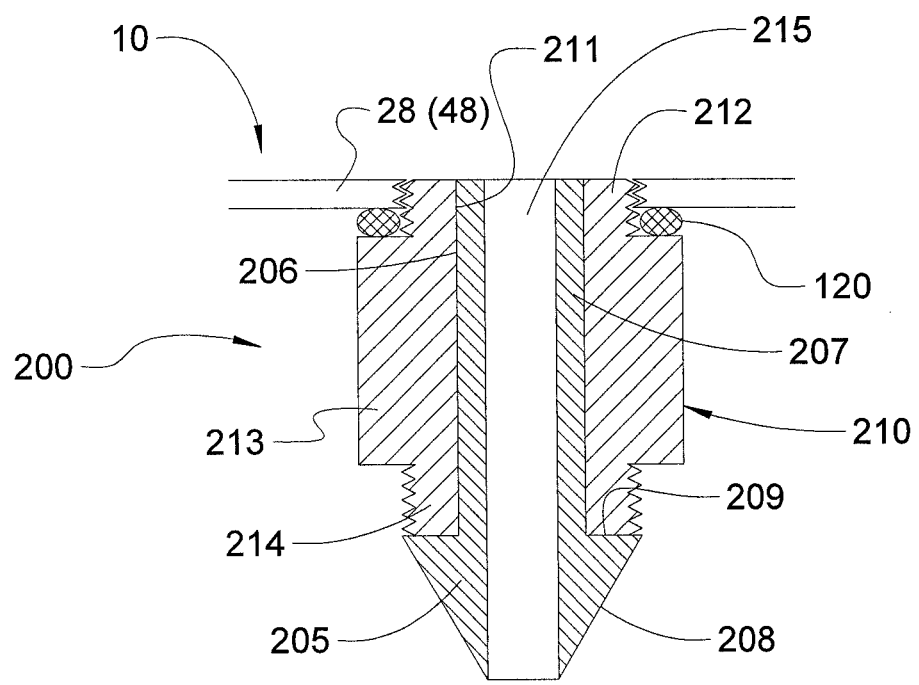
Figure 5:
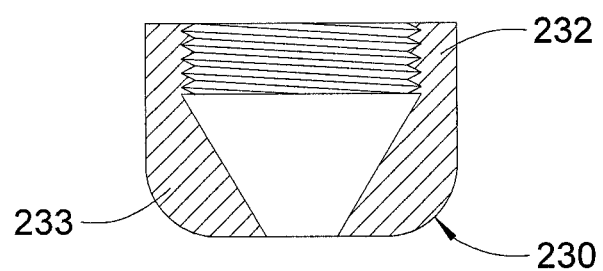
Figure 5:
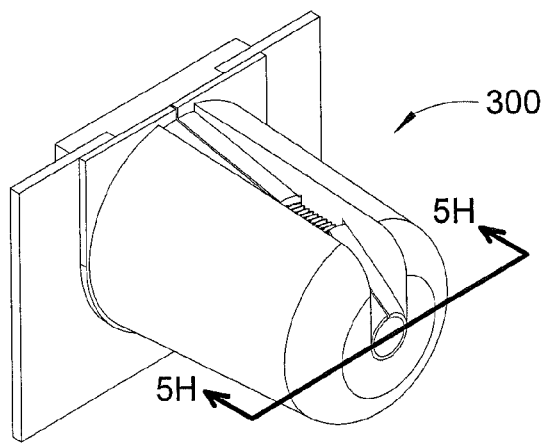
Figure 5:
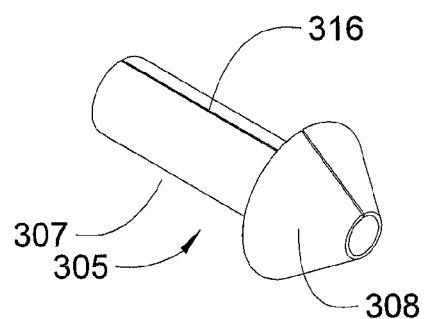
Figure 5:
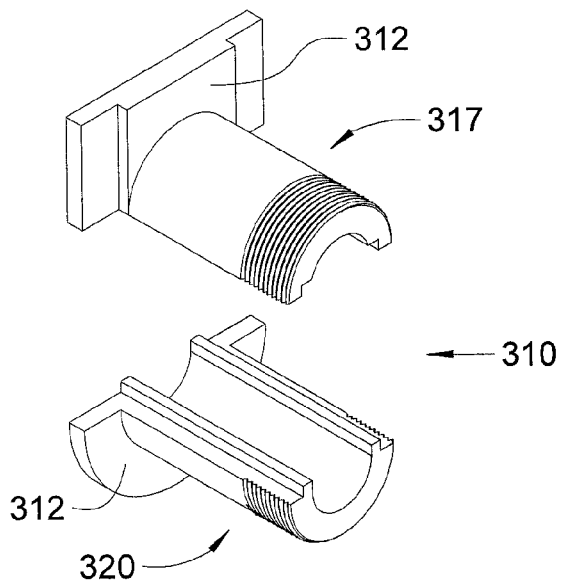
Figure 5:
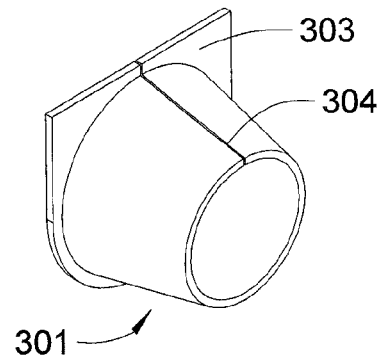
Figure 5:
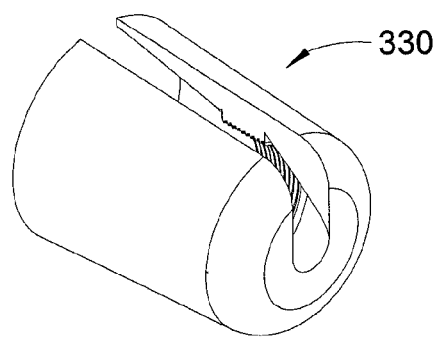
Figure 5:
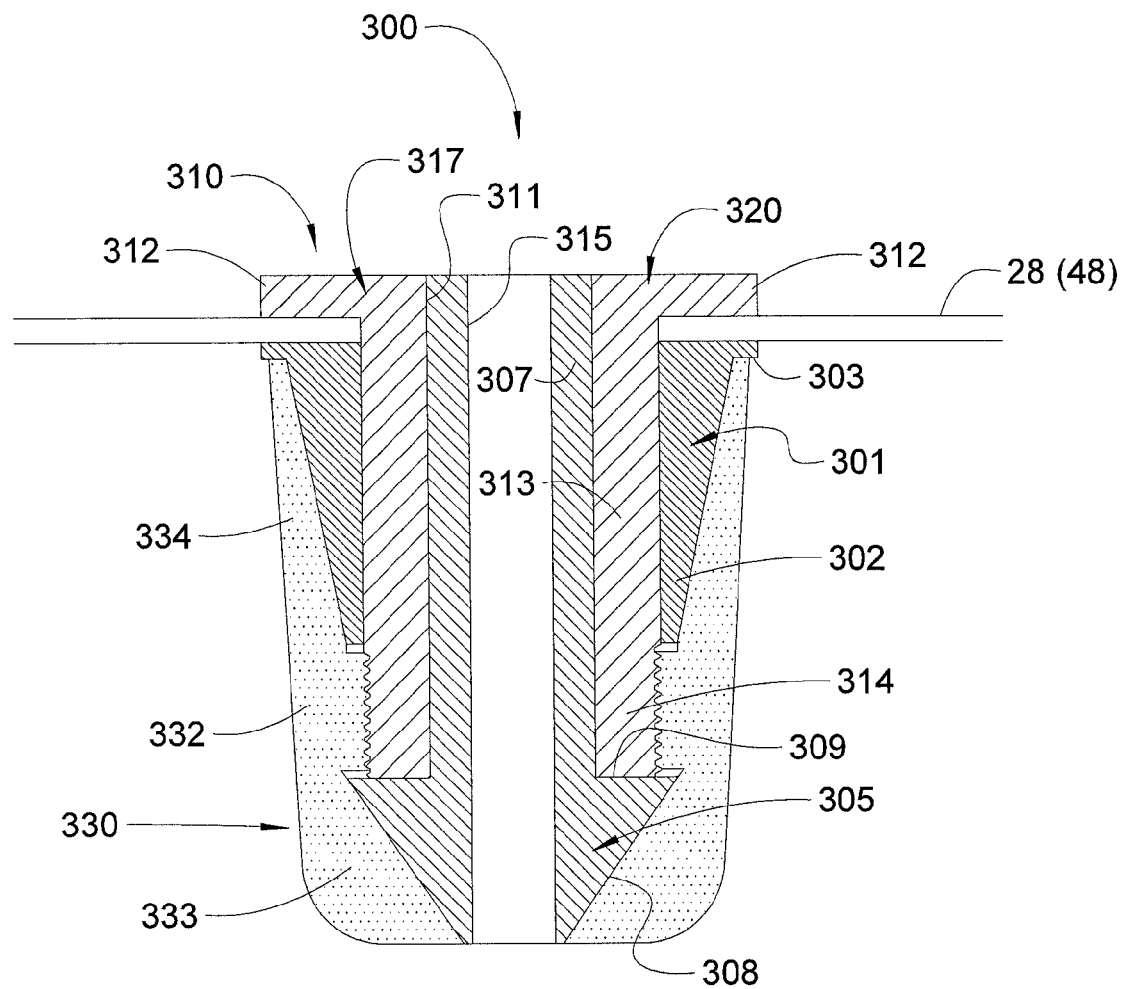

In one embodiment, the male portion 110 may be made of a compressible material, such as an elastically deformable material. In alternative embodiments, only the middle section 113 and the inner channel 115 of the male portion 110 may be made of the compressible material such that the other sections of the male portion 110 such as the first section 112 and the second section 114, which may be opposite ends of the male portion 110, may be rigid. In these embodiments employing the compressible material, cables and/or wires inserted into the insertion element 100 may be fixed by compression of the inner channel 115. In some embodiments, a seal 120 may be placed between the male portion 110 and the housing 10. The seal 120 may be an o-ring, as shown in FIG. 5, a washer, a gasket, or other type of seal.

As further shown in FIG. 5A, a female portion 130 of the insertion element 100 may have a first section 132 that may be attached to the second section 114 of the male portion 110. Such an attachment may be through a threaded connection. The female portion 130 may also have a second section 133 extending from the first section 132 to a second section 134 opposite the first section 132. In some embodiments, the second section 133 of the female portion 130 may taper outwardly from the first section 132 to the second section 134, which is at an end of the female portion 130 opposite the first section 132 at an other end of the female portion 130. Upon connection of the female portion 130 to the male portion 110, an inner portion 138 of the second section 133 of the female portion 130 may have a smaller perimeter than outer portion 118 of the second section 133 of the male portion 110 such that during the connection of the female portion 130 to the male portion 110, the inner portion 138 of the female portion 130 compresses the outer portion 118 of the male portion 110 such that the perimeter of outer portion 118 conforms to and seats against the perimeter of the inner portion 138. In some embodiments, the female portion 130 may be substantially rigid.

As shown in the exploded view of FIG. 5B, in some alternative embodiments, an insertion element 200 may have a male portion 210 with a first section 212 that attaches to the housing 10. The first section 212 may attach to the housing 10 through a threaded connection with either of the outer wall surfaces 28, 48 of the housing 10. In some embodiments, the male portion 210 may have a middle section 213 extending from the first section 212 towards a second section 214. The male portion 210 may have a hole 211 that extends along a longitudinal axis along the entire length of the male portion 210. The male portion 210 may be substantially rigid. In some embodiments, the seal 120 may be placed between the male portion 210 and the housing outer wall 28, 48. The seal 120 may be an o-ring, a washer, a gasket, or other type of seal.

The insertion element 200 may have a central portion 205 having an outer surface 206 defined along a first section 207 thereof by the hole 211 of the male portion 210. An inner channel 215 may extend along an entire length of the central portion 205. A second section 208 of the central portion 205 may have an edge 209 that abuts the male portion second section 214. In some embodiments, the central portion second section 208 may taper inwardly from the edge 209 to an end of the central portion 205. The inner channel 215 may have a diameter appropriately sized to allow an optical fiber cable element or other cables and/or wires to be inserted and, in some embodiments, to be maintained fixed in place within the channel 215 following insertion. The central portion 205 may be made of a compressible material. In these embodiments employing the compressible material, cables and/or wires inserted into the insertion element 100 may be fixed by compression of the inner channel 215.

As further shown in FIG. 5B, a female portion 230 of the insertion element 200 may have a first section 232 that may be attached to the second section 214 of the male portion 210. The attachment of the female portion first section 232 to the male portion second portion 214 may be through a threaded connection. The female portion 230 may also have a second section 233. In some embodiments, the female portion second section 233 may taper inwardly from the first section 232 to an end of the female portion 230. In this manner, the female portion 230 may seat against the central portion 205 upon attachment of the male and female portions 210, 230.

As shown in FIGS. 5C-5H, in some embodiments, an insertion element 300 may have a male portion 310 formed by longitudinally extending upper and lower parts 317, 320. The upper and lower parts 317, 320 may oppose one another to form a longitudinal axis. A rear flange 312 may extend from each of the upper and lower parts 317, 320 of the male portion 310, in a direction substantially perpendicular to the longitudinally extending portions of the parts 317, 320. The rear flange 312 may be adapted to fit within the inner spaces 30, 50 and against the outer wall surfaces 28, 48. In some embodiments, the male portion 310 may have a middle section 313 extending from the rear flange 312 towards a second section 314. The male portion 310 may have a hole 311 that extends along a longitudinal axis over the entire length of the male portion 310.

As shown by FIGS. 5D and 5H, the insertion element 300 may include a central portion 305. The central portion 305 may have a first section 307 that extends along the longitudinal axis of the male portion 310 and that conforms to the hole 311 of the male portion 310, and a second section 308 that extends further along the longitudinal axis. An inner channel 315 may run through the first and second sections 307, 308 of the central portion 305. In some embodiments, the second section 308 may have a face 309 that extends away from and is substantially perpendicular to the longitudinal axis of the male portion 310.

The insertion element 300 may additionally include an inner portion 301 having a tube section 302 and a forward flange 303 extending in a direction substantially perpendicular to a longitudinal axis along which the tube section 302 extends. The inner portion 301 may be made of a compressible material such as that described previously herein. A slit 304 may run longitudinally along a length of the inner portion 301 and allow the inner portion 301 to be wrapped around the upper and lower parts 310, 320. In this manner, the inner portion 301 may tightly surround the upper and lower parts 317, 320 to hold the parts 317, 320 opposed to each other.

As further shown in FIG. 5G and 5H, a female portion 330 of the insertion element 300 may have a first section 332 that may be attached to the second section 314 of the male portion 310. The attachment of the female portion first section 332 to the male portion second portion 314 may be through a threaded connection. The female portion 330 may also have a second section 333. In some embodiments, the female portion second section 333 may taper inwardly from an end of the first section 332 to an end of the female portion 330. In this manner, the second section 333 may seat against the face 309 of the central portion 305 upon attachment of the male and female portions 310, 330. The female portion 330 may further have a third section 334 extending from the second section 333 on a side opposite the first section 332. In some embodiments, the third section 334 may taper outwardly from the intersection of the second and third sections 333, 334 to an end of the third section 334. In this manner, the third section 334 may seat against the tube section 302 of the inner portion 301 along a length thereof. In some embodiments, the end of the female portion third section 334 may seat against the forward flange 303 of the inner portion 301.

By utilizing the upper and lower parts 317, 320 and parts having slits, cables and/or wires can be placed within the insertion element 300 without having to thread or slide the cables and/or wires through the inner channel 315. For example, cables and/or wires can be placed within slit 316 such that the cable runs through the inner channel 307 of the central portion 305. The second section 308 of the central portion 305 may then be compressed around the cables and/or wires in a tight fit. The lower part 320 and the upper part 317 of the male portion 310 can then be placed against one another around the central portion 305. The slit 304 of the inner portion 301 can then be placed around the middle section 313 of the male portion 310 to keep the upper and lower parts 317, 320 together and maintain the assembly of the upper and lower parts 317, 320 and the central portion 305. The female portion 330 may then be attached to second section 314 of the male portion 310, such as through a threaded connection, such that the second section 333 of the female portion 330 is seated against the second section 308 of the central portion 305. In some embodiments, the forward flange 303 may be spaced a distance away from the male portion rear flange 312 substantially equal to a width of either of the outer wall surfaces 28, 48 of the housing 10. In this manner, the entire assembly of insertion element 300 with the cables and/or wires inserted through the inner channel 315 thereof may then be placed into a groove on an edge of either of the outer wall surfaces 28, 48 such that the rear flange 312 of the male portion 310 and the forward flange 303 of the inner portion 301 have a tight or interference fit with the outer wall surface 28, 48. However, the insertion element 300 may also be attached to the outer wall surfaces 28, 48 by a threaded connection to the male portion 310.

Figure 6:
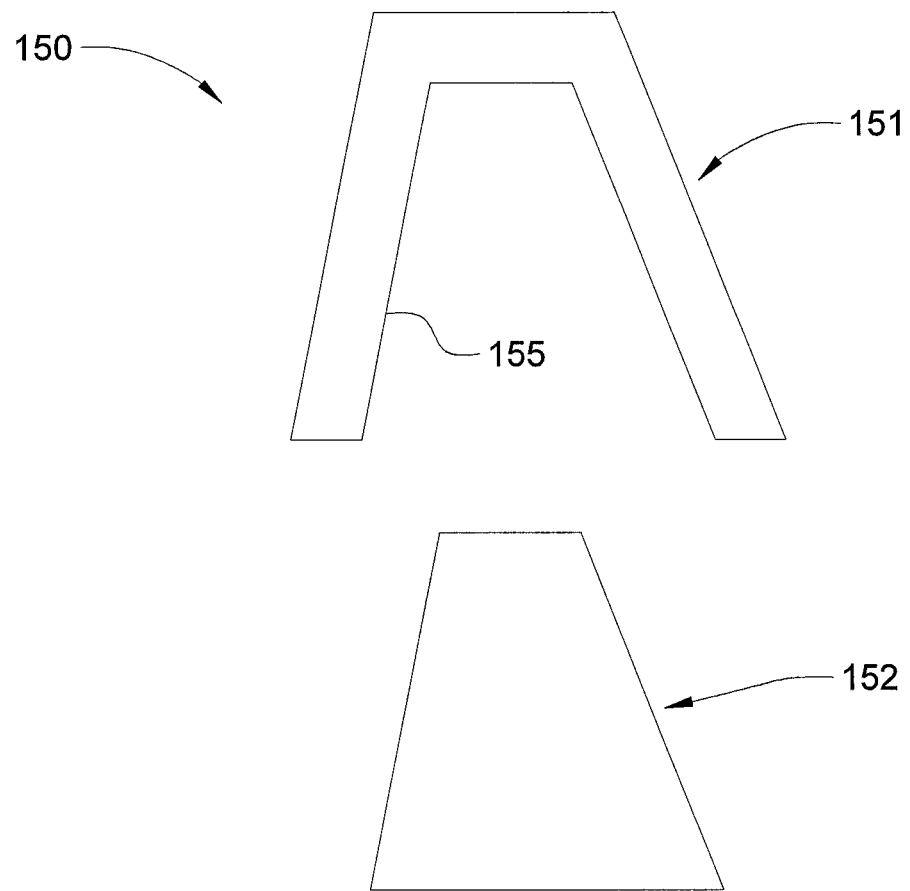
FIG. 6A is a cross-sectional view of a latch of the housing of FIG. 1.
FIGS. 6B, 6B', 6C, and 6C' are cross-sectional views of latches shown in the open and closed positions in accordance with embodiments of the present invention.
Figure 6:
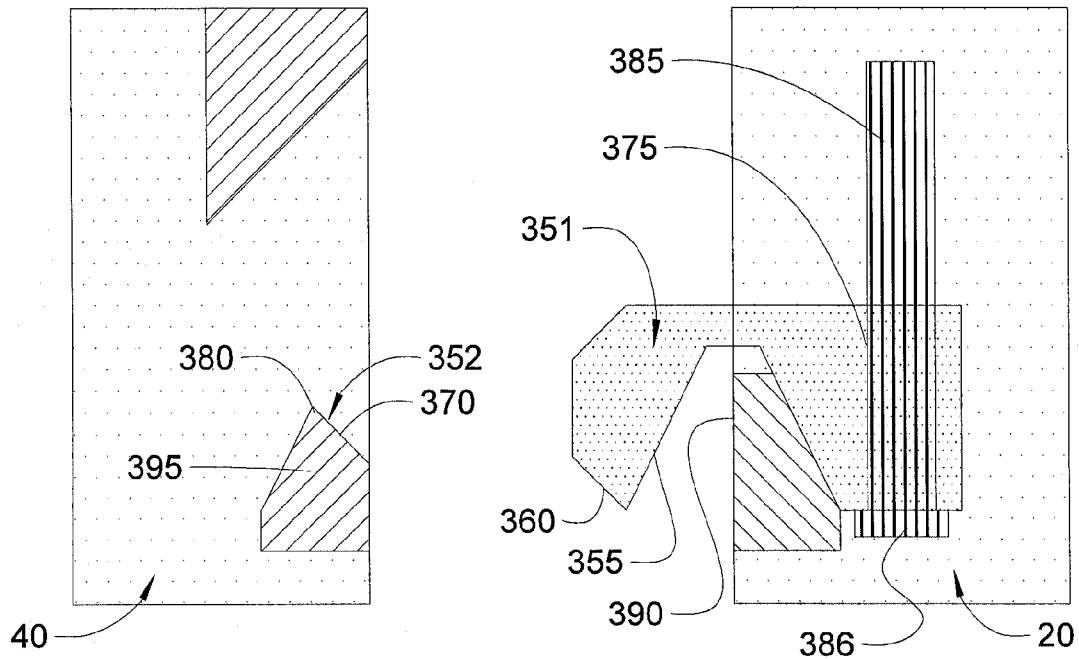
Figure 6:
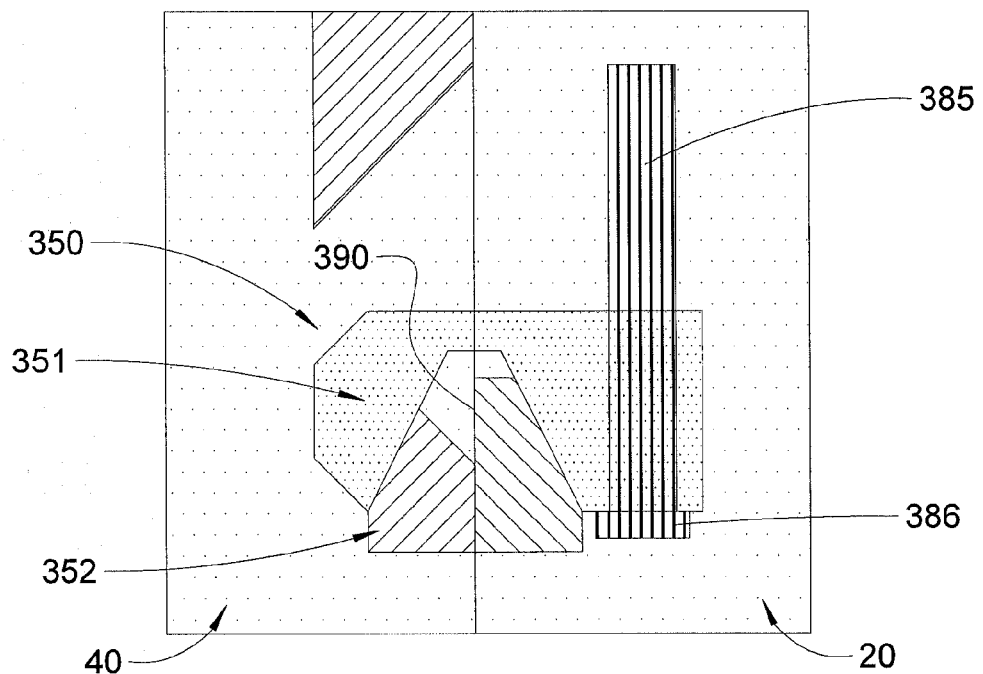
Figure 6:
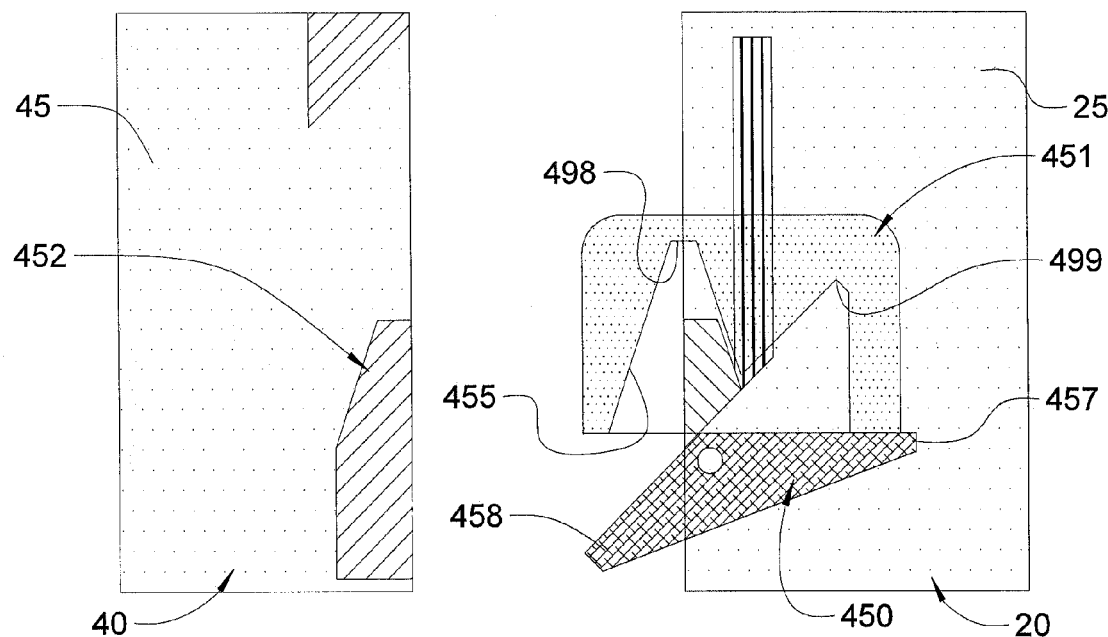
Figure 6:
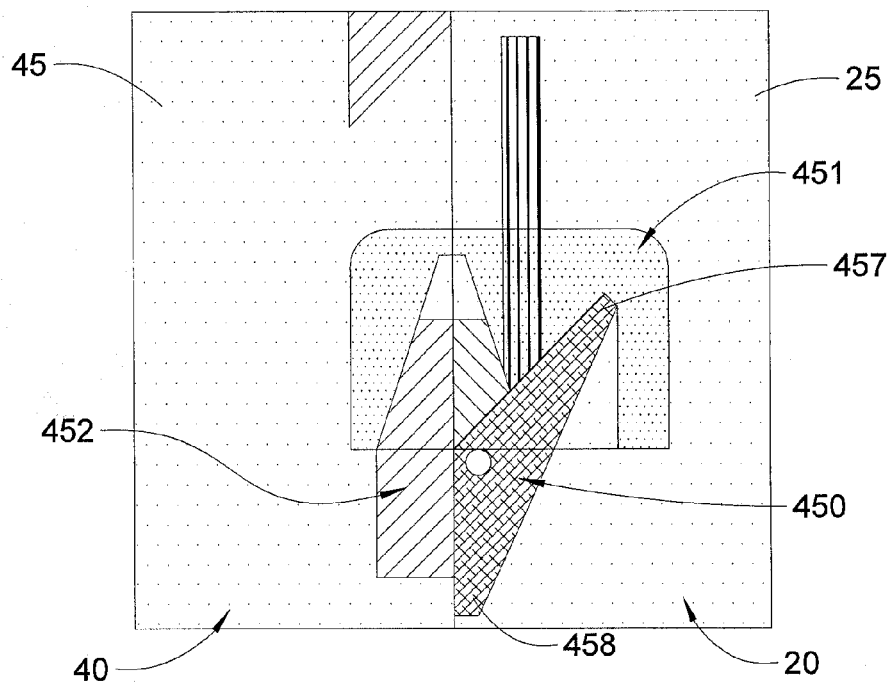

As illustrated in FIGS. 1-3 and in the cross-sectional view of FIG. 6A, the latch 150, 250 may further provide an attachment between the frame 20, 220 and the door 40, 240. As shown in FIGS. 2 and 3, the latch 150 may include two flanges in which one flange has a cavity 155, 255, i.e. a flange with a cavity 151, 251, and the other flange is one which is capable of being received within the flange having the cavity, i.e. a flange without a cavity 152, 252. In an embodiment, the flange with a cavity 151 may be placed on the perimeter 45 of the door 40 and the corresponding flange without a cavity 152 may be placed on the perimeter 25 of the frame 20 as shown in FIG. 2.

As further shown in the embodiment of FIG. 2, the flange with the cavity 151 may form part of a slide mechanism 160 at the perimeter 45 of the door 40. The slide mechanism 160 may include a base portion 165 (shown by dashed lines) that may fit in the inner space 50 of the door 40, as well as the flange 151 that may extend away from the door 40 through a slot 170 formed at the perimeter 45 of the door. The slot 170 and the base portion 165 may be sized such that the base portion 165 of the slide mechanism 160 may be movable along a longitudinal axis of the slot 170 but not be capable of fitting through the slot 170 to an exterior of the door 40, e.g., the environment, on a side opposite the inner space 50 of the door 40. In this manner, when the housing 10 is in an open position, the slide mechanism 160 may be moved to a first position that enables the housing 10 to be placed in a closed position without any interference between the flange with the cavity 151 and the flange without the cavity 152. Then, when the housing 10 is in the closed position, the slide mechanism 160 may be moved to a second position in which the flange with the cavity 151 receives the flange without the cavity 152. In an installation of the housing 10 secured to a vertical surface such as shown in FIG. 1, and further referring to FIGS. 2 and 6, the flange with the cavity 151 may be placed with the cavity 155 facing towards the ground such that when the housing 10 is in the closed position with the slide mechanism 160 placed in the first position, gravity may cause the flange with the cavity 151 on the slide mechanism 160 to move without any additional external forces to the second position, in which the flange with the cavity 151 is engaged with the flange without the cavity 152 by receiving the flange without the cavity 152 therein.

In one embodiment, when the door is rotated to a closed position as shown in FIG. 1, at least a portion of the perimeter 45 of the door overlaps and contacts at least a portion of the perimeter 25 of the frame to form a seal between the contacting portions. In a further embodiment, when the door is rotated to a closed position as shown in FIG. 1, the entire perimeter of the frame overlaps and contacts the entire perimeter of the door to form a seal between the contacting portions.

In another embodiment as shown in FIG. 3, the flange with a cavity 251 may be on the perimeter 25 of the frame 20 and a corresponding flange without a cavity 252 may be on the perimeter 45 of the door 40. As further shown in FIG. 3, the flange without the cavity 252 may form part of a slide mechanism 260 and, may be received within the flange with a cavity 251 in a rest position of the slide mechanism 260 when the housing 10 is in the closed position. In this configuration, with the housing installed such as shown in FIG. 1, the flange with the cavity 251 on the frame 20 has the cavity 255 facing away from the ground such that when the housing 10 is in the closed position, gravity may cause the flange without the cavity 252 to move without any additional external forces to an engaged position, in which the flange with the cavity 251 is engaged with the flange without the cavity 252.

In another embodiment of a latch 350 shown in FIGS. 6B and 6B', the latch 350 may include a slideable flange having a cavity 351 with an angled or beveled portion 360 on an end, and such portion 360 may oppose an angled portion 370 on a flange without a cavity 352 when the housing 10 is approaching the closed position where the frame 20 and the door 40 oppose each other. In some embodiments, the slideable flange 351 may form part of a slide mechanism that slides within a slot as previously described. In other embodiments, a guiderail 385 may be attached to and extend from a portion of either of the outer wall surfaces 28, 48. In these embodiments, the slideable flange 351 may include a channel 375 for the guiderail 385 to pass therethrough such that the slideable flange 351 may slide along the guiderail 385.

The guiderail 385 may include a flange 386 that acts as a positive stop upon which the slideable flange 351 may rest. In this manner, when the door 40 is being rotated to a nearly closed position, the angled portions 360, 370 of the opposing flanges 351, 352 engage each other to cause the slideable flange 351 to move from a rest position to a displaced position until an end 380 of the angled portion 370 of the flange without a cavity 352 enters the cavity 355 of the flange with the cavity 351. As shown in FIG. 6B', in some embodiments, further movement of the door toward the frame may cause the flange without a cavity 352 to contact a wall 390 of the cavity 351 furthest from the flange without a cavity 352. Upon contact, the frame 20 and the door 40 may be in the closed position such that a portion 395 of the flange without a cavity 352 is received within the flange with the cavity 351.

In another embodiment shown in FIGS. 6C and 6C', the frame 20 may further include a lock 450 that is rotatably attached to and extends from the frame perimeter 25. The lock 450 may be rotatable about an axis perpendicular to the perimeter 25. The lock 450 may have a first portion 457 located adjacent to a slideable flange having a cavity 451 when the flange is in a first position such that, upon a rotation of the lock 450, the flange 451 slides in the direction of a second position. The lock 450 may further have a second portion 458 that faces flange without a cavity 452 such that when the frame 20 and the door 40 are near contacting each other, a force provided by the flange without a cavity 452 against the second portion 458 of the lock 450 causes the rotation of the lock 450.

The cavity 455 may have a shape for receiving the first portion 457 of the lock 450 such that, when the door 40 is rotated to a closed position opposing the frame 20, the first portion 457 of the lock 450 has a fixed position within the cavity 455. In some embodiments such as the one shown in FIG. 6C, the flange with a cavity 451 may have a cavity 455 having multiple peaks or indentations 498, 499 in which a peak 498 closer to the flange without a cavity 452 when the housing 10 is the nearly closed position receives the flange without a cavity 452. In this configuration, the other peak 499 may receive the first portion 457 of the lock 450.

When the door is rotated to an open position, the lock 450 may be biased towards a rotational position, such as with a spring attaching the lock 450 to the frame, such that upon release of the slideable flange with the cavity 451, the slideable flange 451 rests on the lock 450 and does not receive the lock.

Although every configuration of the latch is not shown in the figures, it should be appreciated that the flanges with and without the cavity may be placed on either of the frame or the door perimeters with the corresponding flange placed on the other of the frame and the door perimeters. Likewise, in some embodiments, the slide mechanism may be placed on either of the door and the frame perimeters. When a flange that moves due to gravity and without external forces being used to place a flange in an engaged position in which the flange without the cavity is received in the flange with the cavity is desired, the cavity may face the ground when the flange with the cavity forms part of the slide mechanism. Alternatively, the cavity may face away from the ground when the flange with the cavity forms part of the slide mechanism.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A housing for optical elements comprising:
   a frame including a frame perimeter and a plurality of fasteners positioned at the frame perimeter; and
   a door rotatably coupled to the frame, the door including a door perimeter capable of mating engagement with the frame perimeter, and a plurality of fasteners positioned at the door perimeter,
   wherein the frame includes a frame flange extending from a first portion of the frame perimeter and the door includes a door flange extending from a first portion of the door perimeter,
   wherein one of the door flange and the frame flange is a flange with a cavity capable of receiving the other of the door flange and the frame flange, and wherein the flange with a cavity is slideable to a first position such that the cavity receives the other of the door flange and the frame flange, and wherein the flange with a cavity is slideable to a second position such that the other of the door flange and the frame flange is external to the flange with a cavity,
   wherein one of the frame and the door further includes a lock extending from the frame or the door perimeter and rotatable about an axis perpendicular thereto,
   the lock having a first portion located adjacent to the flange with a cavity when the flange with a cavity is in the first position such that, upon a rotation of the lock, the flange with a cavity slides in the direction of the second position, and
   the lock further having a second portion facing the other of the door flange and the frame flange such that when the door and the frame are about to contact one another, a force provided by a contact of the other of the door flange and the frame flange upon the second portion causes the rotation of the lock, and
   the lock having a length and the cavity having a shape for receiving the lock such that, when the door is rotated to a closed position opposing the frame, the lock has a fixed position within the cavity.

2. The housing of claim 1, wherein the plurality of fasteners of the door are magnetically attractable to the plurality of fasteners of the frame.

3. The housing of claim 1, wherein the plurality of fasteners of the frame are positioned at least at a majority of the frame perimeter with a larger proportion of the fasteners of the frame at a first portion of the frame perimeter and the remaining fasteners of the frame at a second portion of the frame perimeter.

4. The housing of claim 1, the frame further including a frame seal perimeter adjacent to the frame perimeter and the door further including a door seal perimeter adjacent to the door perimeter,
   wherein an outer perimeter of one of the frame seal and the door seal perimeters is greater than an entirety of the outer perimeter of the other of the frame seal and the door seal perimeters, and
   wherein, when the door is rotated to a closed position opposing the frame, at least a portion of the one of the frame seal and the door seal perimeters overlaps at least a portion of the other of the frame seal and the door seal perimeters to form a seal therebetween.

5. The housing of claim 4, wherein, when the door is rotated to the closed position opposing the frame, the entirety of the one of the frame seal and the door perimeters overlaps the entirety of the other of the frame seal and the door seal perimeters.

6. The housing of claim 5, wherein the one of the frame seal perimeter and the door seal perimeter includes a female coupling and the other of the frame seal and the door seal perimeters includes a male coupling such that, when the door is rotated to the closed position opposing the frame, the male coupling of the one of the frame seal and the door seal perimeters is capable of insertion into the female coupling of the other of the frame seal and the door seal perimeters to form the seal.

7. The housing of claim 6, wherein a compressible sealing mechanism within the female coupling of the one of the frame seal and the door seal perimeters is adapted for sealing engagement with the male coupling of the other of the frame and the door seal perimeters.

8. The housing of claim 1, wherein the frame includes an outer wall defining an opening adapted to be attachable to an insertion element having an inner channel extending therethrough.

9. The housing of claim 8, wherein the insertion element comprises:
   a male portion having a first section attached to the frame outer surface and a middle section extending from the first section to a second section of the male portion, the middle section being compressible such that the inner channel deforms to a predetermined fixed cross-section to substantially create a seal to an optical fiber cable element when the element is positioned extending therethrough, and
   a female portion having a first section attachable to the male portion second section and a second section extending from the first section to an end of the female portion and adapted to seat against the middle section of the male portion, the female portion being substantially rigid.

10. The housing of claim 8, wherein the insertion element comprises:
   a male portion having a first section attached to the frame outer surface and a middle section extending from the first section to a second section of the male portion, each of the sections defining a hole along a longitudinal axis thereof and at least the middle section being substantially rigid,
   a central portion including the inner channel and an outer surface at least partially defined by the hole of the male portion, the central portion being compressible such that the inner channel deforms to a predetermined fixed cross-section to substantially create a seal to an optical fiber cable element when the element is positioned extending therethrough, and
   a female portion having a first section attachable to the male portion second section and a second section adapted to seat against the central portion upon attachment of the female portion to the male portion, the female portion being substantially rigid, wherein the central portion extends substantially along a length of the male and female portions when the portions are in an attached configuration.

11. The housing of claim 10, wherein the male portion middle section has a larger cross-section than a cross-section of the male portion first end, the male portion middle section being adapted to provide for a sealing means adapted to form a seal between the male portion first end and the frame outer surface when the insertion element is attached to the frame outer surface.

12. The housing of claim 10, wherein the male portion second section is substantially rigid, and wherein the central portion includes a tapered section extending form an edge such that the female portion second section is adapted to seat against the tapered section of the central portion and the male portion second section is adapted to seat against the edge of the central portion when the female portion first section is attached to the male portion second section.

13. The housing of claim 1, wherein, when the housing is positioned such that the flange with a cavity slides between the first position and the second position substantially orthogonal to ground, the flange with a cavity slides from the first position to the second position without contacting the other of the door flange and the frame flange.

14. The housing of claim 1, wherein the frame and the door are rotatably coupled at a hinge,
   wherein at least one fastener of the frame and at least one corresponding fastener of the door are positioned adjacent to the hinge, and
   wherein, upon mating engagement of the frame and the door, at least some of the plurality of fasteners of the frame oppose and are detachably engageable with at least some of the plurality of fasteners of the door such that the frame and the door are detachably engageable with each other around their respective perimeters.

* * * * *

UNITED STATES PATENT AND TRADEMARK OFFICE
CERTIFICATE OF CORRECTION

| | | |
|---|---|---|
| PATENT NO. | : 8,672,428 B2 | Page 1 of 1 |
| APPLICATION NO. | : 13/279874 | |
| DATED | : March 18, 2014 | |
| INVENTOR(S) | : Kenichiro Takeuchi et al. | |

It is certified that error appears in the above-identified patent and that said Letters Patent is hereby corrected as shown below:

IN THE CLAIMS

Column 12, line 20, "form" should read --from--.

Signed and Sealed this
Fifth Day of January, 2016

Michelle K. Lee
*Director of the United States Patent and Trademark Office*